United States Patent [19]
Cronin et al.

[11] Patent Number: 5,845,572
[45] Date of Patent: Dec. 8, 1998

[54] CIRCUIT BOARD SCREENER SPOT SUPPRESSOR

[75] Inventors: John V. Cronin, Newport Beach; Tan Y. Ly; Peter R. Rose, both of Santa Ana, all of Calif.

[73] Assignee: Circuit Automation, Inc., Irvine, Calif.

[21] Appl. No.: 743,870

[22] Filed: Nov. 5, 1996

[51] Int. Cl.⁶ ..................................... B41F 15/12
[52] U.S. Cl. .......................... 101/123; 101/129; 101/425
[58] Field of Search ..................... 101/123, 124, 101/126, 129, 423, 425; 427/96, 282; 118/213, 264, 406

[56] References Cited

U.S. PATENT DOCUMENTS

| | | | |
|---|---|---|---|
| 4,937,097 | 6/1990 | Ichinose et al. | 427/96 |
| 4,957,044 | 9/1990 | Cronin | 101/35 |
| 5,070,782 | 12/1991 | Sakai et al. | 101/123 |
| 5,265,531 | 11/1993 | Cronin | 101/35 |
| 5,485,781 | 1/1996 | Rovaris | 101/129 |

*Primary Examiner*—Ren Yan
*Attorney, Agent, or Firm*—Fulbright & Jaworski LLP

[57] ABSTRACT

A vertical screening apparatus in which the a circuit board in transported into and out of a print zone before and after vertical reciprocation of flood blades, spot suppressor squeegee, and print squeegee. A spot suppressor squeegee is provided to smear dots of ink residing on the inside a screening membranes after a previous circuit board has been screened.

12 Claims, 14 Drawing Sheets

CIRCUIT BOARD SCREENER SPOT SUPPRESSOR

CROSS-REFERENCE TO RELATED APPLICATIONS

This application claims the benefit of U.S. Provisional Application Ser. No. 60/007,253 filed Nov. 6, 1995.

FIELD OF THE INVENTION

This invention relates generally to the field of print screening devices. More particularly, the invention relates to the provision of a screen printing assembly capable of eliminating ink spots remaining on screening membranes after a circuit board has been screened.

BACKGROUND OF THE INVENTION

Photopolymers have found widespread application in the preparation of printed circuit boards and other electronic devices. These materials are applied to circuit boards by screen printing and/or stenciling techniques which are well known in the art. Applicant's prior U.S. Pat. No. 4,404,903 describes a semi-automatic device that uses a horizontal print stroke to print a photoimagable soldermask ink simultaneously on both sides of a board. Applicant's prior U.S. Pat. No. 4,957,044 describes an automatic device that uses vertical flood and print strokes to print photoimagable soldermask ink simultaneously on both sides of a board. Applicant's prior U.S. Pat. No. 5,265,531 describes a reciprocally shuttled double sided screener with tiltable print squeegee assembly capable of printing both sides of a circuit board simultaneously. There are numerous advantages to simultaneously printing both sides of the board including: the avoidance of many individual handling steps; a single baking step that avoids the undercure of one side and overcure of the other when two separate printing steps are used; the prevention of oxidation of the copper which can occur when one side is uncoated during baking; the prevention of contamination when a board is handled with one side coated before the other; and elimination of the side-to-side variation inherent with single-sided coaters.

Typically, a single flood stroke is used followed by one or more print strokes. When a printed circuit board is screened, the ink that was over a hole in the board can be forced through the board and resides on the inside of the screen as a "latent image" (i.e. a dot of ink). This latent image survives the flood stroke and can redeposit itself onto the subsequent board. U.S. Pat. No. 4,957,044 provided a mechanism for avoiding the clogging of holes in the circuit boards with the soldermask ink. This was accomplished by jogging the chase holding the screens between each sequence of flood and print strokes. While the mechanism of chase jogging between flood and print sequences went a long way toward eliminating the build-up of soldermask ink in the circuit board holes, it did little to eliminate the latent image problem wherein the presence of ink dots residing on the inside of the screen after a circuit board is screened are transferred to the next board as spots of ink after the flood stroke. As the quality and complexity of printed circuit boards increases, the thickness of the deposit of ink onto the board has to be extremely even, but the latent image dots cause problems in the thickness of the deposit and, therefore, the accuracy of the printed board. For example, if the ink is redeposited onto the next board, it can produce an uneven depth of ink on the board surface. Another negative effect of this latent image is that if the ink dries before it is deposited onto the next board, it may cause a void area to be left at that location of the board. Another difficulty relating to the latent image is the fact that once the latent image has formed, there is not enough room between the screens to reach in and clean the latent image off of the screens unless a portion of the device is disassembled. Such disassembly would be time consuming and messy because ink would get all over the device and its surroundings.

There is one machine currently on the market that does utilize a wire-type wiper to eliminate excess ink residing on the inside of the screens. This machine is currently being marketed under the name Ichinose and is made by a Japanese manufacturer. In the operation of the Ichinose machine, the screens have to separate and there has to be an independent wipe stroke, that is, the wipers go in and wipe the excess ink off the inside of the screens. The instant invention does not require that the screens be separated, as the spot suppressor operates on the outside of the screens, and does not require an independent stroke.

SUMMARY OF THE INVENTION

The present invention overcomes the foregoing problems by using two squeegees on each side of the screening membranes, each in vertical alignment with the other. Once the screens have been flooded with ink, a circuit board is moved into the print zone, and one squeegee on each side extends and descends, forcing the screens into contact with the board in a usual print stroke, thereby applying ink onto the board. The board is then transferred out of the print zone and the second squeegee on each side is then applied as a spot suppressor squeegee, causing the screens to contact each other and smear the ink dots, while the flood blade simultaneously trails the spot suppressor squeegee and floods the screens with ink.

More particularly, the present invention provides a compact form of vertical screener in which the board is reciprocally shuttled into and out of the print zone from one side of the apparatus, as in U.S. Pat. No. 5,265,531, which is hereby incorporated by reference. The double sided vertical screening apparatus includes a feed rack assembly for driving vertically mounted printed circuit boards to a board transport mechanism from which boards are sequentially transported reciprocally into and out of the print zone of the vertical print assembly. After a board emerges out of the print zone after the print stroke, the board is replaced in the rack assembly. When the rack is full of coated boards, it is taken to an oven to be tack dried.

The board transport mechanism comprises a channel with an endless chain that can be rotated in either direction, which chain carries a shuttle bar fitted with a feed dog that interacts with the board and with a friction mechanism to accurately locate the horizontal position of the board. The board transport mechanism and other details of the reciprocally shuttled double sided screener are shown in Applicant's prior U.S. Pat. No. 5,265,531.

In the preferred embodiment, the screen print assembly comprises two chases, two ink wells, and a flood blade and squeegee vertical drive system comprising two sets of squeegees, but in the alternative, one set of squeegees and one set of rollers can be used. The chases are vertically mounted in opposing spatial relationship to facilitate the simultaneous application of photopolymer soldermask deposits on each side of the target circuit board. As is well known in the art, pliable penetrable screening membranes, commonly referred to as screens, are mounted within each chase. Each chase is pivotally mounted on its base to facilitate separation of the screening membranes from the target circuit boards following the print stroke.

The squeegee vertical drive system is formed from opposing flood blades and two sets of squeegees (or in the alternative one set of squeegees and one set of rollers) conjunctively mounted on horizontal bars which reciprocate through vertical planes on opposite sides of the vertical chases. The horizontal bars are each slidably connected to guide bars which are mounted on the screener base and are driven by ball screw systems. A single chain drives all four screw systems.

Photopolymer soldermask material is applied to target circuit boards in the following manner. Before a board is moved into the print zone, the squeegee vertical drive system begins a vertical rise with flood blade extended, during which the flood blades lift ink from a well at the bottom of the print zone to flood the screening membrane while the spot suppressor squeegees, also extended, simultaneously cause the membranes to contact each other, thereby smearing ink left over on the inside of the screens from the printing of the previous circuit board, thus eliminating unwanted soldermask deposit on the inside of the screen. Once the squeegee vertical drive system reaches the upper limit at the top of the screening membranes, the flood blades and spot suppressor squeegees retract. A circuit board is then transported into the print zone, followed by a descent of the squeegee vertical drive system where print squeegees extend and displace the inked membranes of each chase and cause them to contact each side of the circuit board for simultaneous printing. Once the vertical drive system reaches the lower limit at the bottom of the screen, the print squeegees retract. At this point, additional, non-flood rises followed by additional print strokes can be accomplished, but are not necessary. After the last print stroke, the circuit board is transferred out of the print zone and replaced in the rack assembly.

At this point, the flood/spot suppression/print sequence is accomplished again, that is, the squeegee vertical drive system begins another vertical rise as the flood blades lift ink from the well and flood the screening membranes, while the spot suppressor squeegees smear ink left over on the inside of the screens from the printing of the previous circuit board. The next circuit board is transported into the print zone and the vertical drive system descends accomplishing another print stroke. At the end of the print stroke, with the chases in a fully opened position, the board transport assembly moves the printed board from the print zone back out to the rack. As each printed board is removed from the printing zone and replaced in the rack, the rack indexes forward and another board is placed in the channel. The system can thus run continuously with only minor manual operation.

DETAILED DESCRIPTION OF THE INVENTION

Figure 1:
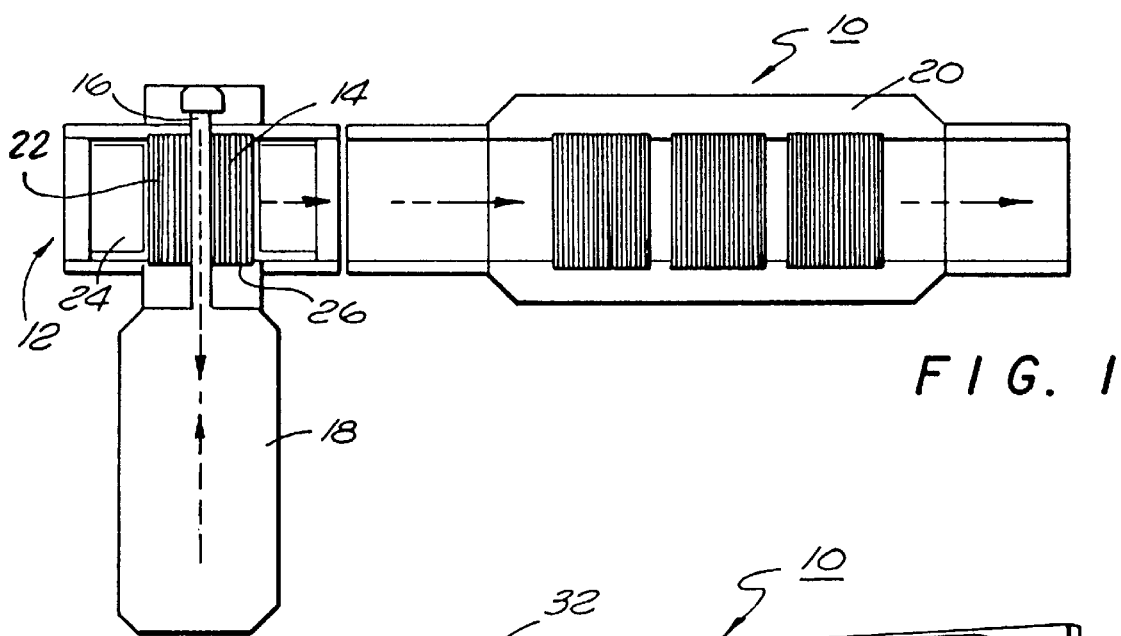
FIG. 1 is a schematic top plan view of a double sided screening apparatus that has been constructed in accordance with the present invention.

Referring to FIG. 1, a schematic top view of an automated screening apparatus 10 is shown. The apparatus has a feed mechanism 12 that sequentially drives printed circuit boards 14 to contact a board transport mechanism 16 which removes a board 14 from the feed mechanism 12, feeds it into the print zone of a screen print assembly 18 and then carries it back out to the feed mechanism 12, which is indexed to start the cycle over again. The feed mechanism 12 has a slotted platen 22 slidably connected to a table 24 to facilitate movement of the platen 22 as needed to advance printed circuit boards 14 that have been loaded on their edges into slots 26. The slotted platen 22 is chain driven by a dc motor (not shown) mounted under the table 24. After a predetermined number of the boards have been processed, the boards as a group are transported to a curing oven 20. The apparatus is computer driven to control this sequential operation.

Figure 2:
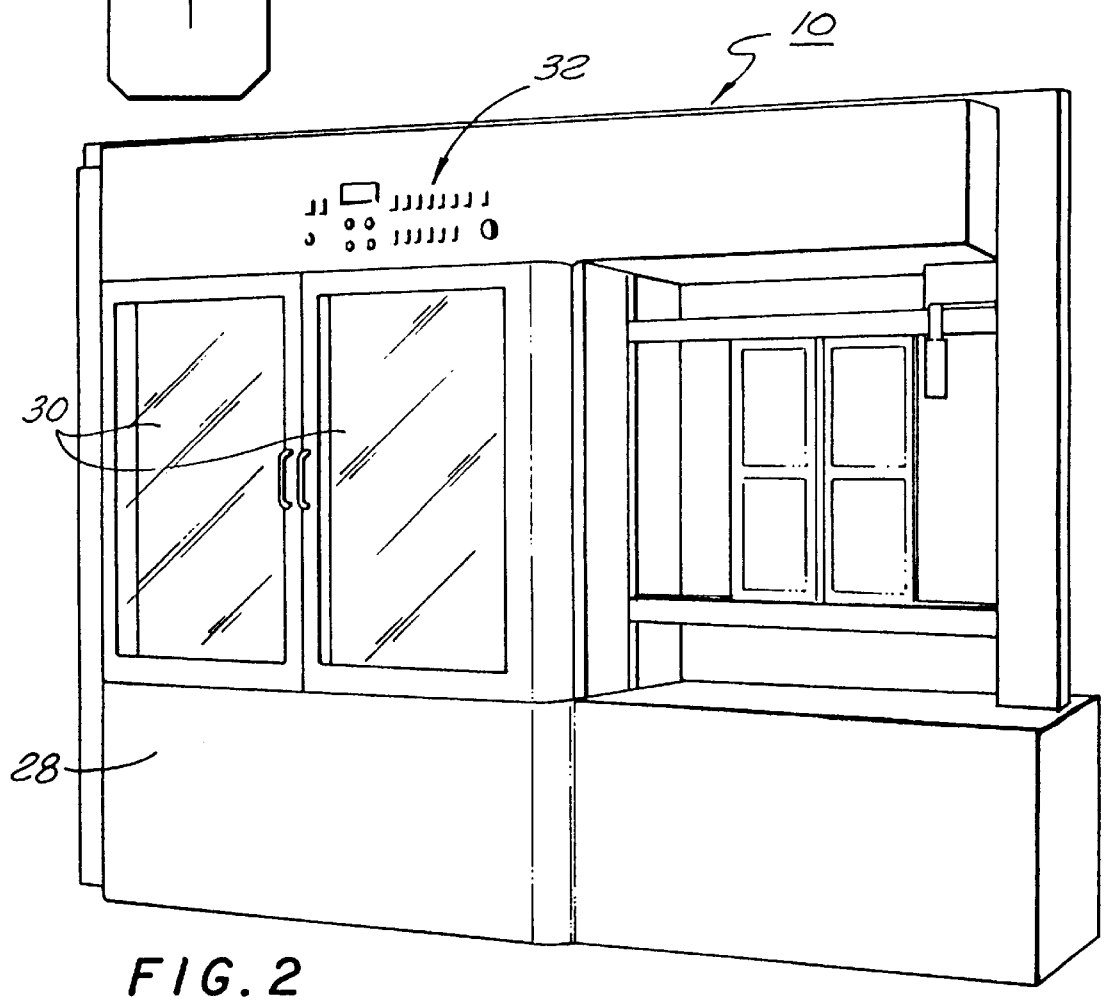
FIG. 2 is a pictorial view of the invention and associated enclosure, less feed and output racks.

A pictorial view of one embodiment of the screening apparatus 10, less the feed mechanism 12, is shown in FIG. 2. Here, the screen print assembly is in a protective enclosure 28 which serves to facilitate atmospheric control over print conditions and minimize contamination of the photo-imagable soldermask materials. The enclosure 28 is vented, the vents being regulated by a servo motor to maintain a slight positive pressure, e.g. about 1 inch water. An operator may monitor the print stroke via viewing windows 30 provided on the front, as well as on the rear side, of the enclosure 28. A control panel 32 at the top of the enclosure enables computer control of the apparatus.

Figure 3:
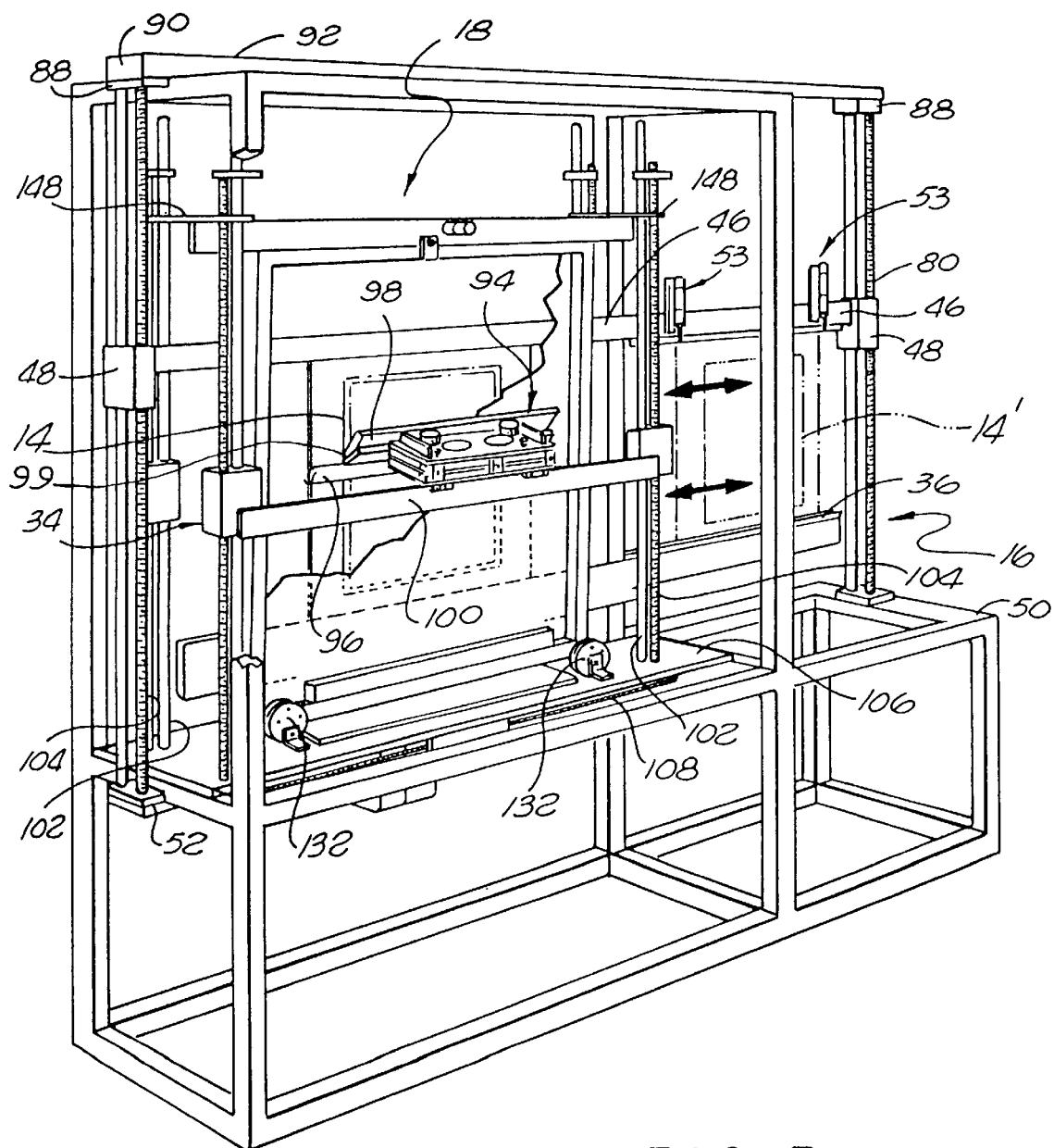
FIG. 3 is a perspective view of the invention less feed and output racks and omitting some details.

FIG. 3 shows a circuit board 14 in place in the print assembly 18 section of the apparatus and also shows the print board in shadow at 14' at its location just prior to insertion into the screen print assembly 18. When the circuit board 14 is fully located within the screen print assembly 18, it is simultaneously printed on each side by a squeegee vertical drive system 34, and unloaded without being touched by human hands.

Figure 4:
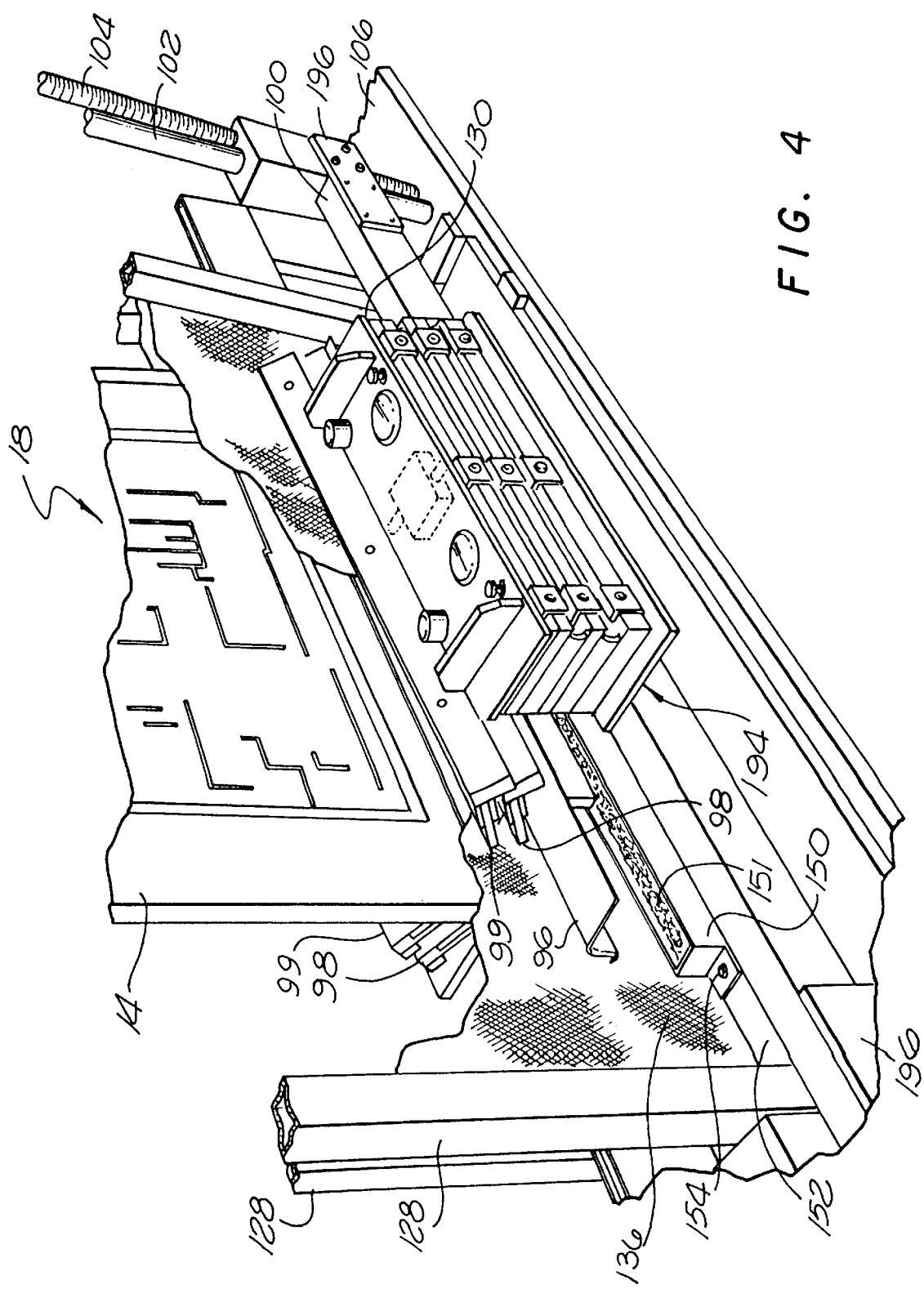
FIG. 4 is a partial perspective view of the invention showing a portion of the screen print assembly.

As shown also in FIG. 3, a mounting plate 46 is spaced upwardly from a channel 36, and extends cross the entire apparatus, secured at each end by housing blocks 48 that are slidably connected to the assembly frame base 50 at the input end and to an extension 52 thereof at the opposite end. Two clamp assemblies 53 are spaced apart on the mounting plate 46 on the entry side of the screen print assembly 18. FIGS. 3 and 4 provide an overall view of the screen print assembly 18. A squeegee vertical drive system 94 is formed by conjunctively mounting opposing flood blades 96, opposing print squeegees 98, and spot suppressor squeegees 99 onto cross members 100. The cross members 100 are slidably attached as hereinafter described, to guide bars 102, and they are screw driven in a vertical plane by screw systems 104 which are mounted on each of the four corners of a system base plate 106. Further details of the squeegee vertical drive assembly can be seen in FIGS. 5, 6, 7, 8, 9 and 10.

Figure 6:
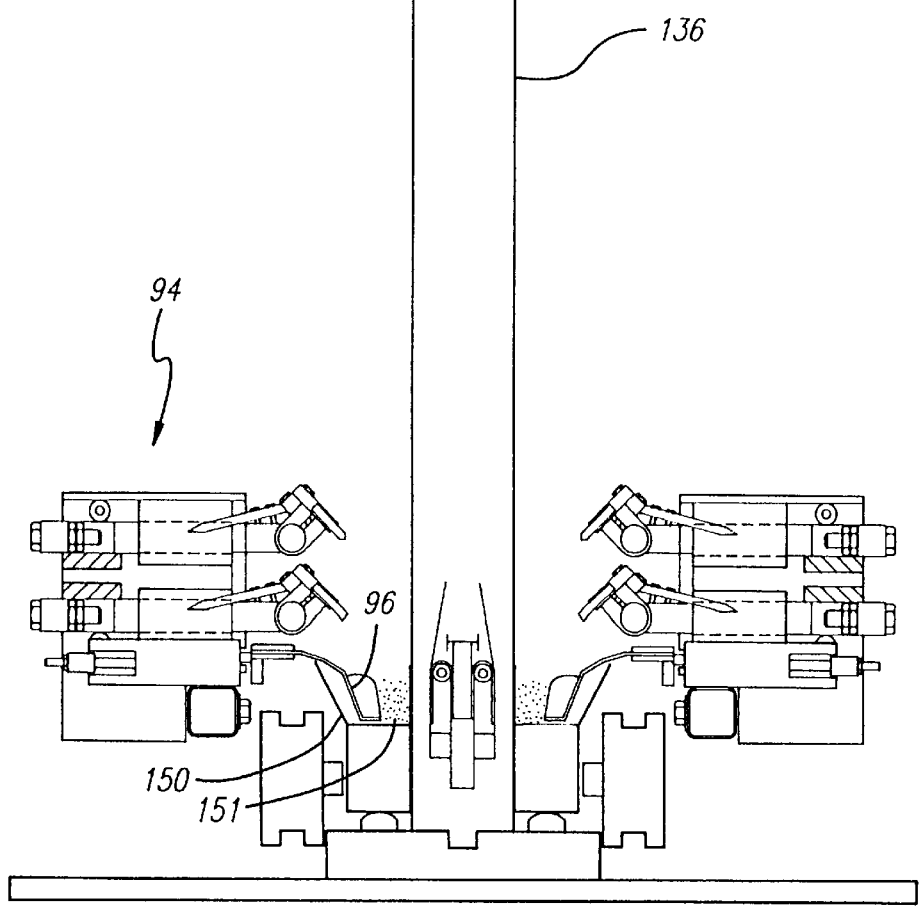
FIG. 6 is a schematic cross-section of the invention showing squeegee vertical drive system before the flood stroke.

Of critical importance to the printing sequence is the transfer of photoimagable soldermask material, commonly referred to as "ink", to the screen. Referring to FIGS. 4 and 6, an ink reservoir 150, containing ink 151, is provided along the top surface 152 of each chase 128 so as to be positioned proximate to the screen 136. The ink reservoir 150, containing ink 151, is removably connected to the chase base with suitable attachment means, such as allen screws 154. This facilitates cleaning and enables the ink to be more easily saved after the chase is removed. In the alternative, the ink reservoir can be attached to an arm designed to rotate away from the machine so that said alien screws can be omitted as discussed in further detail in Applicant's co-pending provisional application, Ser. No. 60,006,129.

Figure 5:
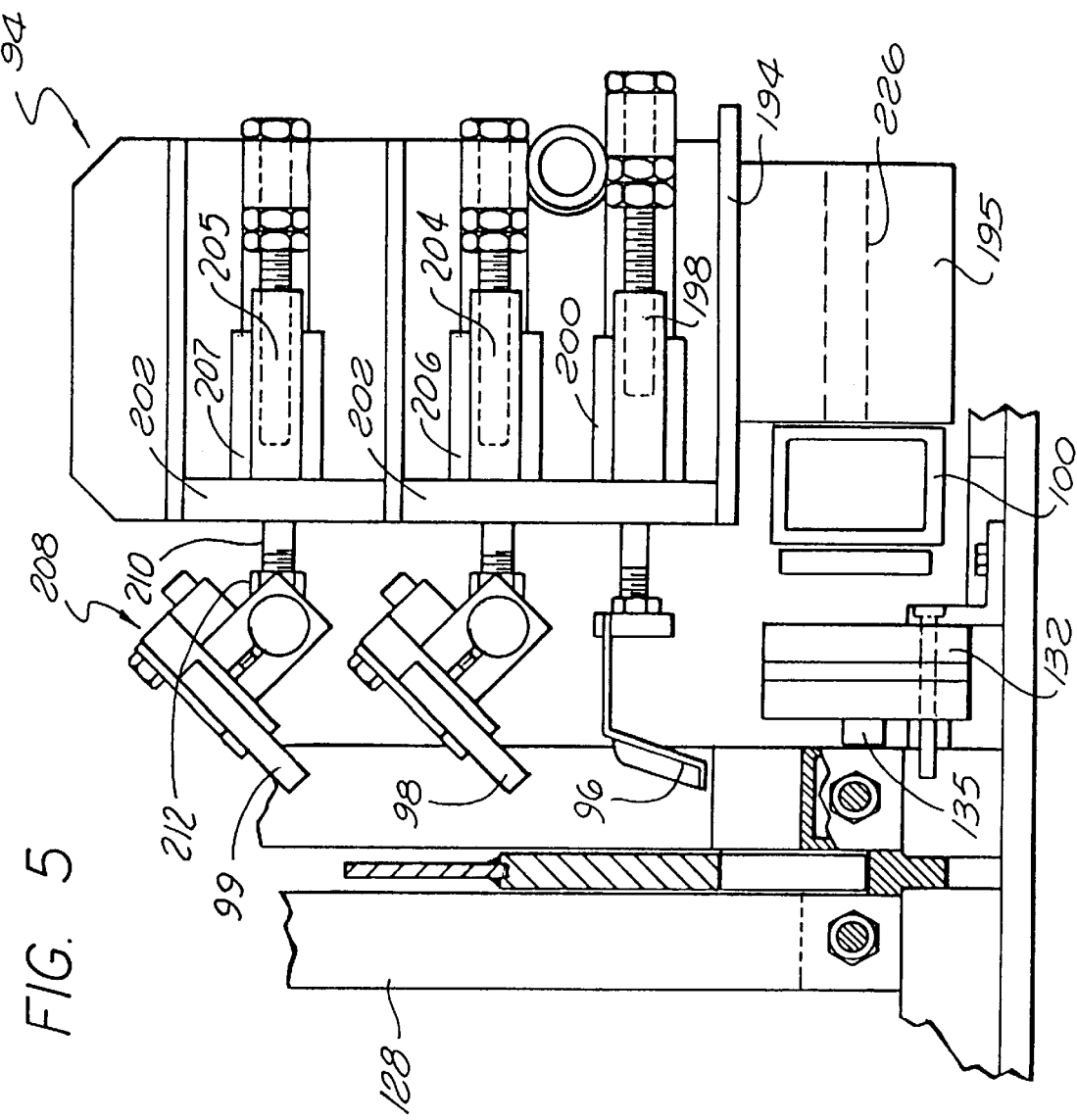
FIG. 5 is a partial cross-sectional view of the invention showing one side of the squeegee system.
Figure 9:
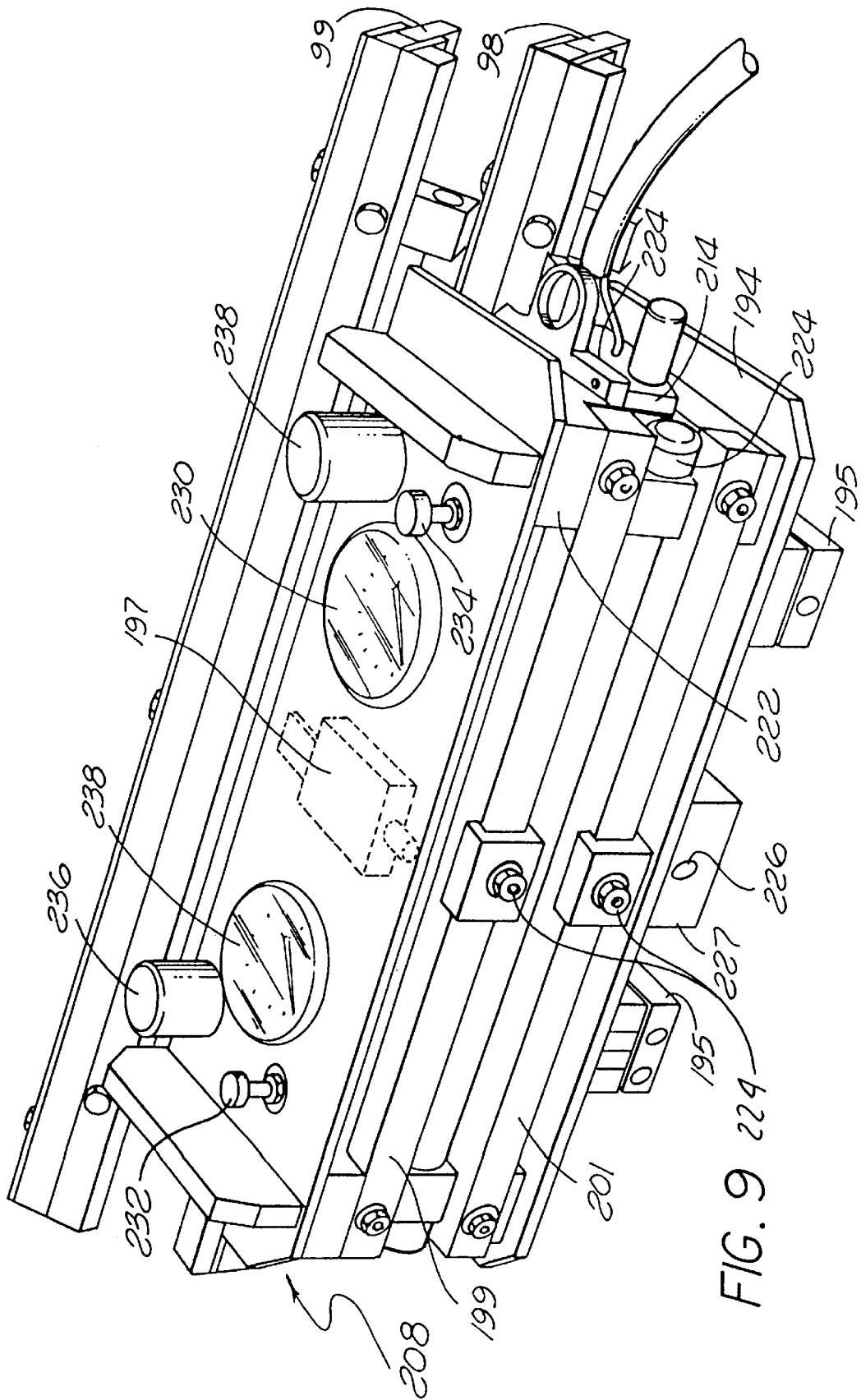
FIG. 9 is a perspective view of the flood bar/print squeegee assembly head.

To further describe the design and operating characteristics of the squeegee vertical drive system element of this invention, attention is again directed to FIG. 4 together with FIG. 9. A flood blade 96, a print squeegee 98, and a spot suppressor squeegee 99, are each mounted on a platform 194. The platform 194 is joined by legs 195 to a horizontal cross member 100 that has attachment flanges 196 on each end thereof. Referring also to FIG. 5, the flood blade 96 is joined to a hardened steel Thompson rod 198 carried by a lower linear bearing 200 which extends through an aperture in the vertical wall 202 connected to the platform 194.

Referring to FIG. 5, a print squeegee 98 and a spot suppressor squeegee 99 are disposed over the flood blade 96 on the same vertical wall 202. The print squeegee 98 is joined to a hardened steel Thompson rod 204 carried by an upper linear bearing 206 extended through an aperture in the vertical wall 202. The spot suppressor squeegee 99 is joined to a hardened steel Thompson rod 265 carried by an upper linear bearing 207 extended through an aperture in the vertical wall 202. Pivotal attachment is accomplished by a squeegee pivot assembly 208 formed of a bar 210 and a clamp 212 which can be adjusted to accomplish a desired vertical angle for the squeegee.

Stops 214 (FIG. 9) are provided to separately limit the horizontal movement of the flood blade and print squeegee. Preferably, stops are used on one chase while the print squeegee on the other chase operates without stops (or with stops at extreme positions). This enables the opposing squeegees to achieve and maintain parallel alignment.

Figure 7:
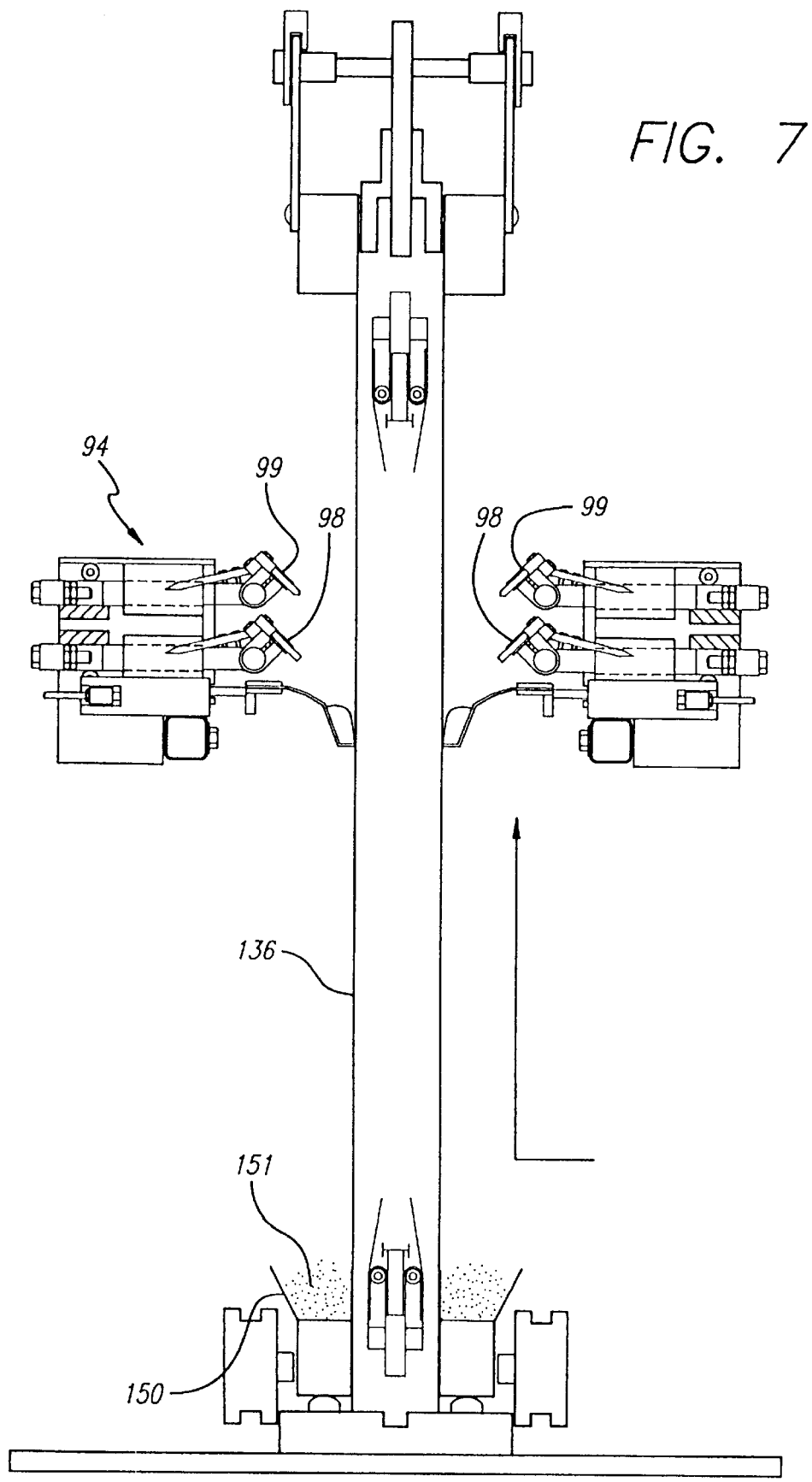
FIG. 7 is a schematic cross-section of the invention showing the flood stroke.
Figure 8:
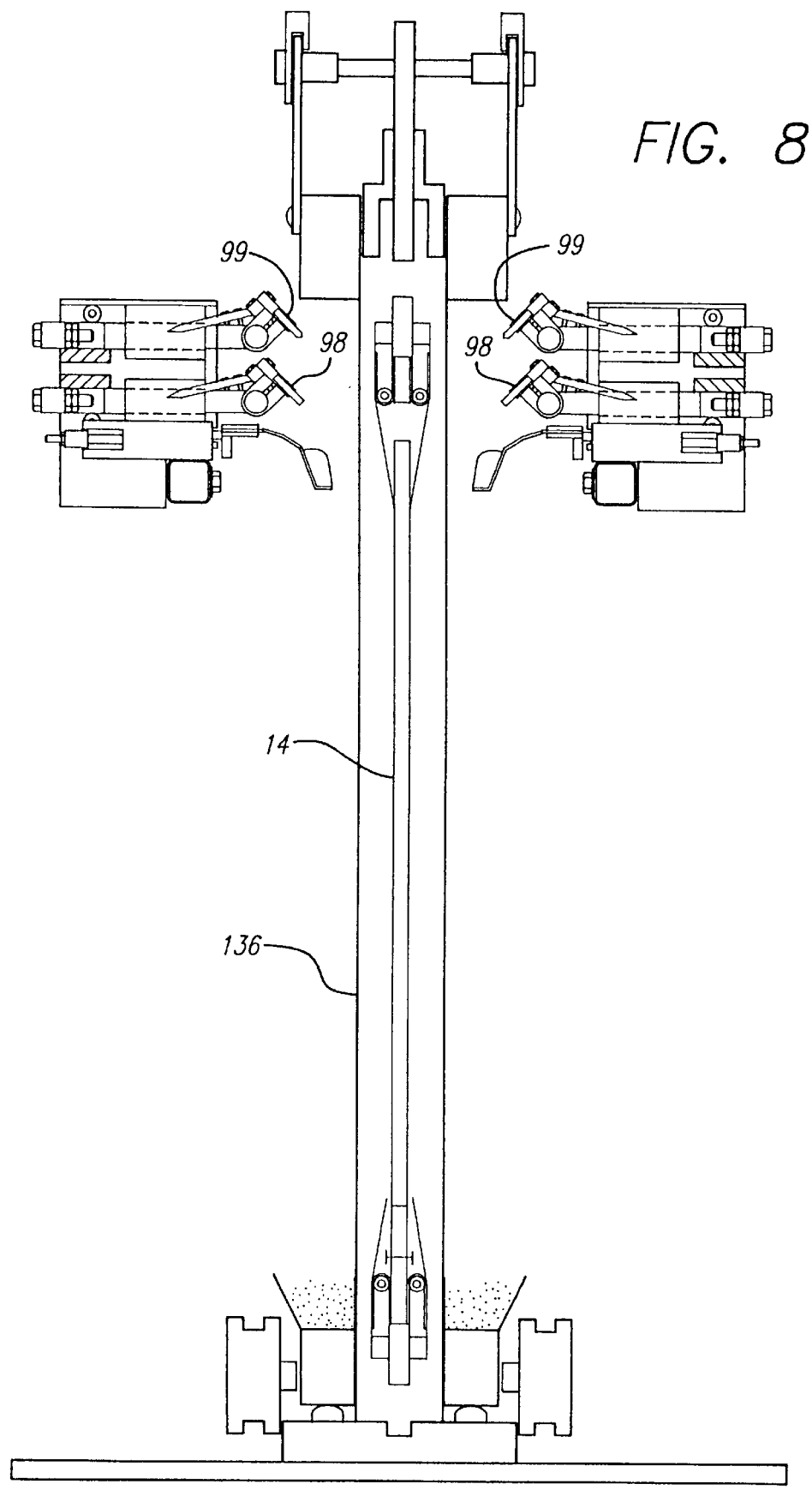
FIG. 8 is a schematic cross-section showing the squeegee vertical drive system after the flood stroke and before the print stroke.
Figure 11:
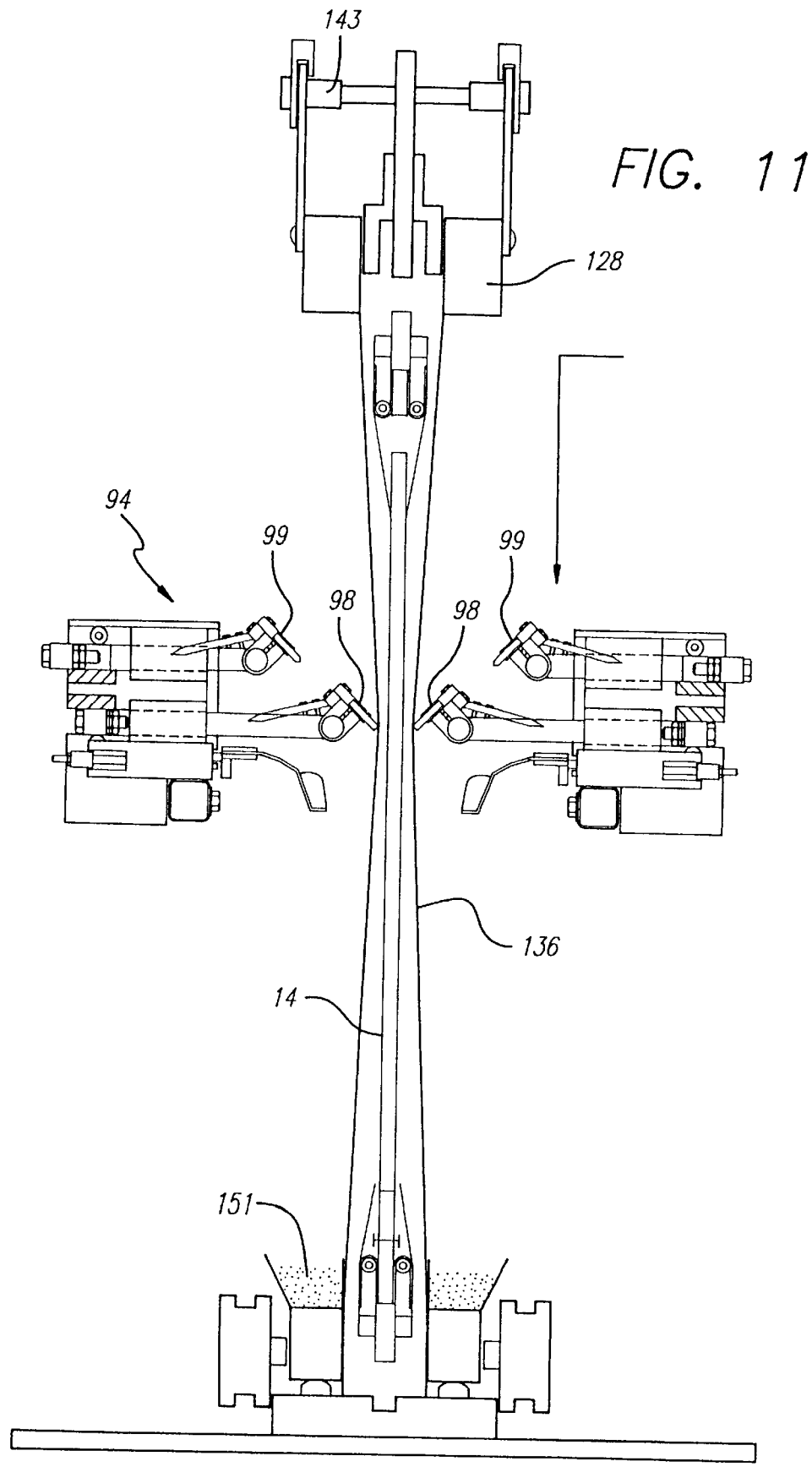
FIG. 11 is a schematic cross-section showing the squeegee vertical drive system during the print stroke.

Referring to FIG. 6, at the start of a flood/print sequence, the squeegee vertical drive system 94 is at the bottom of the screen print assembly 18. The flood blades 96 are immersed in the ink 151 in the ink reservoir 150. Referring to FIG. 7, as the sequence begins, the vertical drive system 94 rises from the ink reservoir 150 thereby spreading the ink 151 onto the surface of the screen 136. The print squeegees 98 and spot suppressor squeegees 99 remain in their initial positions away from the print screen. Referring to FIG. 8, after the vertical drive system reaches the top of the area to be printed, the flood blades 96 are retracted and the circuit board 14 moves into the coating area from the feed mechanism 12. Referring to FIG. 11, at the start of the downward print stroke, the print squeegees 98 are pushed toward their respective screens 136, impinging the inside surface of each screen onto the respective surface of the circuit board 14. As the drive system 94 descends, the print squeegees 98 progressively sweep ink 151 through the screens onto the surface of the board 14. Finally, at the bottom of the screens, the print squeegees 98 and squeegee pivot assemblies 208 are retracted, as shown in FIG. 6. At the same time, the chase pivot drive 143 is activated.

Activation of the chase pivot drive 143 causes the chases 128 to pivot about their respective bases and causes the screens 136 to separate from the board 14. As the chases 128 are separated, the inked screens 136 are pulled away from the inked board 14.

Figure 12:
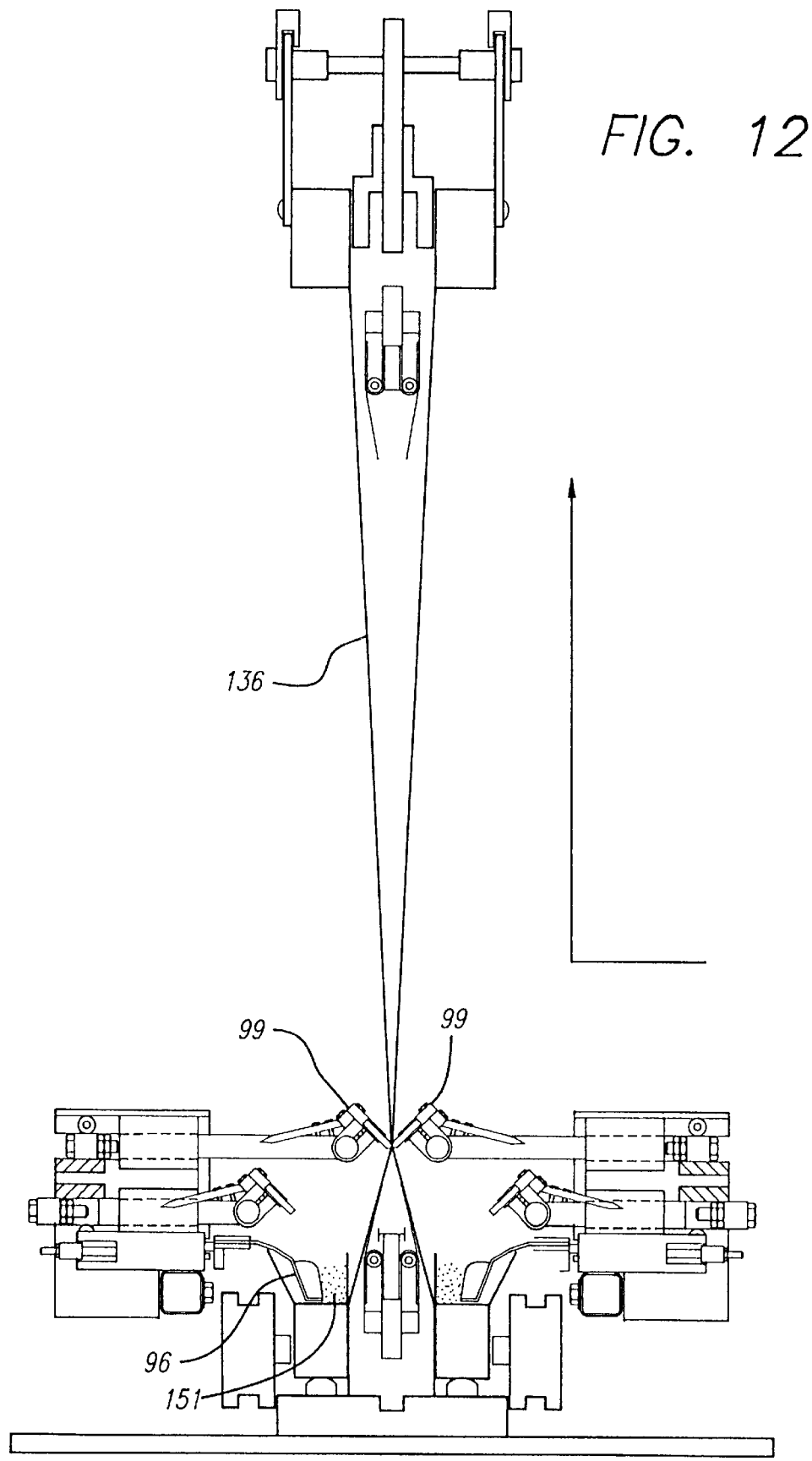
FIG. 12 is a schematic cross-section showing the beginning of the spot suppression/flood stroke.
Figure 13:
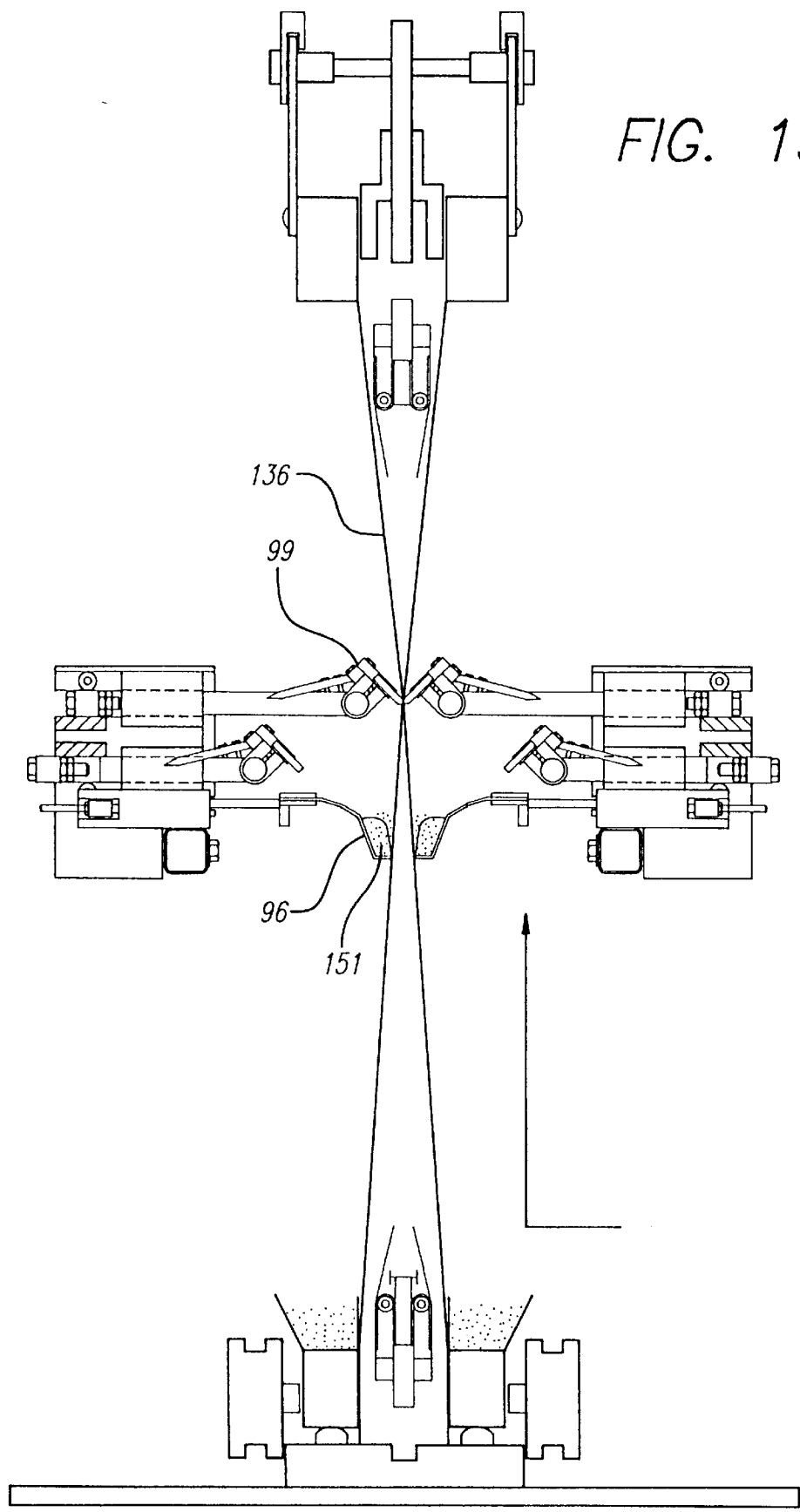
FIG. 13 is a schematic cross-section showing the middle of the spot suppression/flood stroke.
Figure 14:
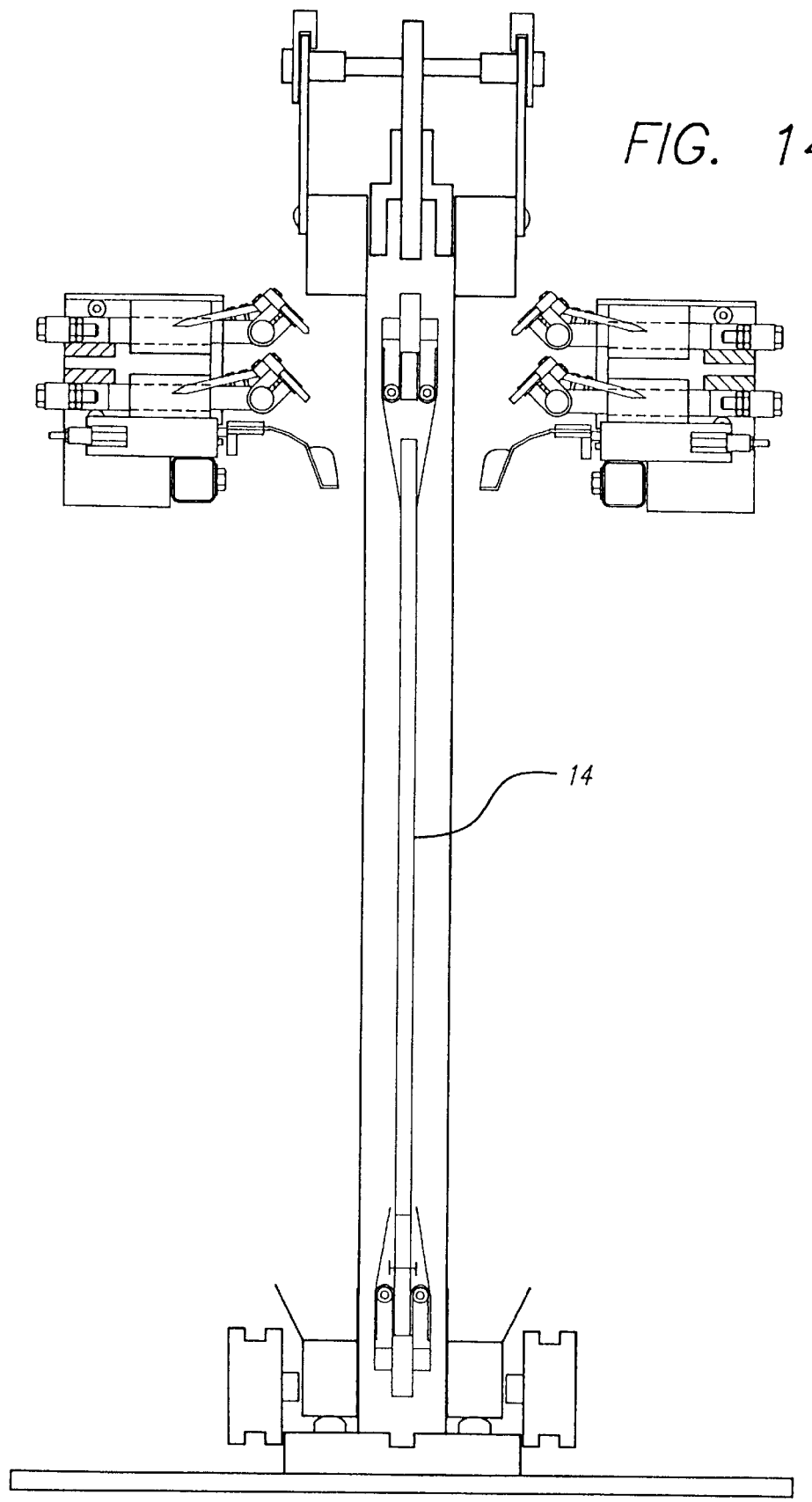
FIG. 14 is a schematic cross-section showing squeegee vertical drive system after the flood stroke and before the print stroke.

After the print stroke the circuit board 14 is carried out of the print zone of screen print assembly 18 to the feed mechanism 12. Referring to FIGS. 12 and 13, before the next circuit board is carried into the print zone, each spot suppressor squeegee 99 extends and the squeegee vertical drive system 94 begins a vertical rise so that each spot suppressor squeegee 99 forces their respective screens 136 together, thereby progressively smearing the dots of ink residing on inside of the screens 136 from coating of the previous circuit board, thus eliminating unwanted ink deposit on the inside of screen 136. Simultaneously, the flood blades 96 extend to pick up ink 151 from the ink reservoir 152 and trails the spot suppressor squeegee 99. Referring to FIG. 14, the circuit board 14 is then transported into the print zone. FIGS. 11–14 are then repeated on subsequent machine cycles.

Referring now to FIG. 9, the squeegee pivot assembly 208 is shown in greater detail. The print squeegee 98 and spot suppressor squeegee 99, are each connected by the Thompson rods and their linear bearings (hidden in FIG. 9) to a carriage 222 which rotates around a pivot point 224 and which is carried by the platform 194. The squeegees are independently connected to separate solenoids (shown in shadow at 197) that operate on respective cross bars 199 and 201 to move the squeegees in and out.

Figure 10:
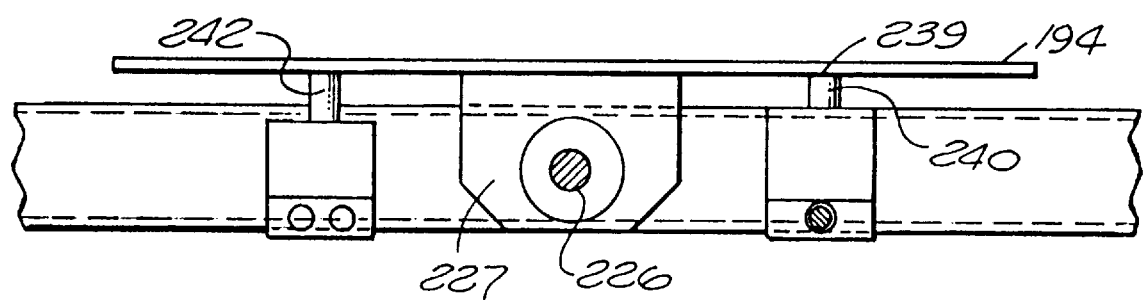
FIG. 10 is a schematic view of the print squeegee platform and support.

FIG. 10 in conjunction with FIG. 4 show the mechanism for the print squeegee. The platform 194 is pivotally attached at 226 to cross member 100 and leveled by pneumatically driven piston rods 240 and 242.

Figure 15:
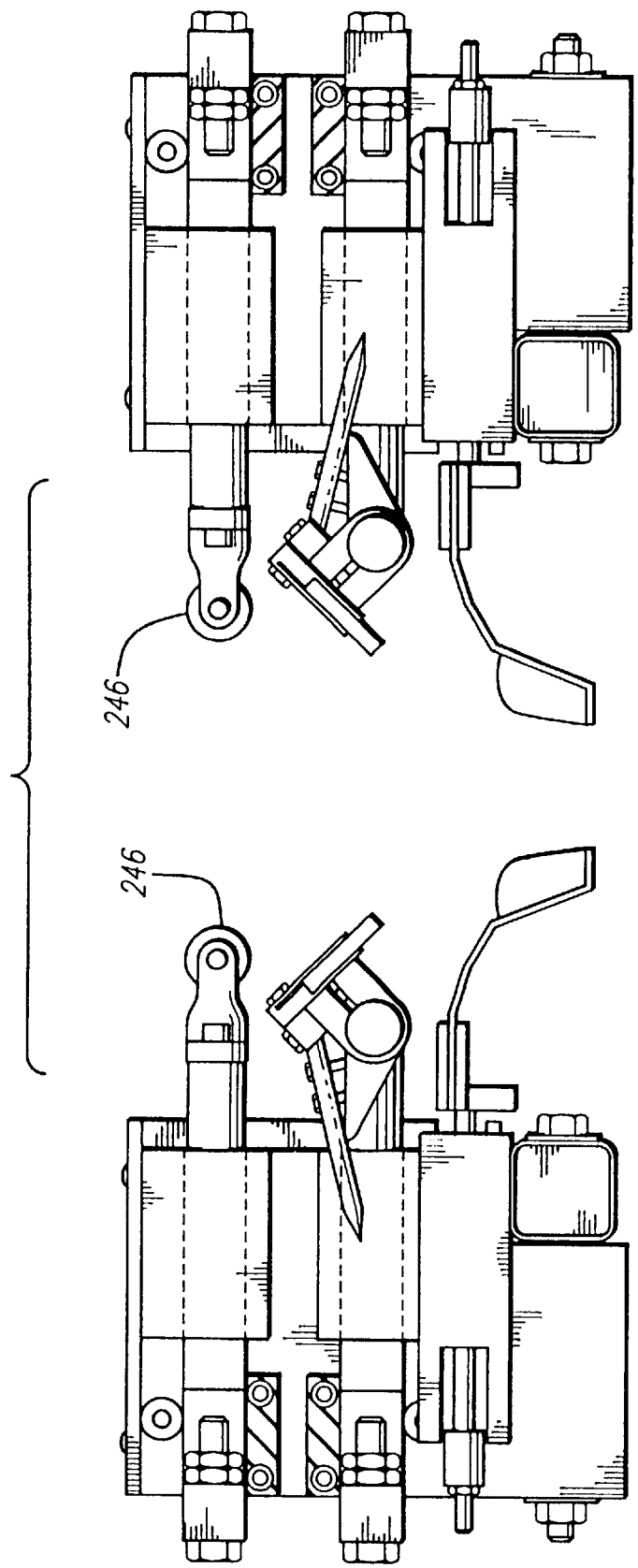
FIG. 15 is a partial cross-sectional view of the squeegee vertical drive system showing a roller in place of the spot suppressor squeegee.

The invention is not limited to the particular embodiment shown in the drawings. For example, the spot suppressor squeegee could be replaced by any device capable of pressing the screens together while smearing the dots of ink. FIG. 15 shows a roller 246 in place of the spot suppressor squeegee 99.

Moreover, the spot suppressor stroke could either start at the bottom or at the top of the screening membranes. The advantage of having the spot suppressor stroke start at the bottom of the screens is that the spot suppressor can work simultaneously with the flood bar in the same stroke. It also may be desirable, but not necessary, to include more than one print stroke. In order to accomplish one or more additional print strokes, after the first descent of the print squeegee and just before the flood blade reaches the ink reservoir, the print assemblies are raise by the vertical drive system without a flood stroke. When the assembly reaches the top of the screen, a the print squeegee extends, and an additional print stroke is executed.

Finally, while the invention is shown in conjunction with a reciprocally shuttled double sided screener, the invention could also be used in any automatic screening device that uses vertical flood and print stokes to print photoimagable soldermask ink simultaneously on both sides of a board.

It will be appreciated by persons skilled in the art that the present invention is not limited to what has been shown and described hereinabove, nor the dimensions of sizes of the physical implementation described immediately above. The scope of invention is limited solely by the claims which follow.

What is claimed is:

1. In a vertical screening apparatus for simultaneously screening each side of a board with inking material in which a first and second vertically oriented chase are mounted in opposing spaced relationship with respect to each other, wherein a screening membrane is mounted within each of said first and second chase, and which opposing flood blades and print squeegees are vertically reciprocated through flood and print sequences on opposite sides of said first and second chase, the improvement comprising a spot suppressor vertically reciprocated on each of said screening membranes in sequence with vertical reciprocation of said print squeegees and said flood blades, wherein said spot suppressor suppresses said inking material by forcing each of said screening membranes in contact with each other after said print sequence.

2. The improvement according to claim 1, wherein said spot suppressor is a squeegee.

3. The improvement according to claim 1, wherein said spot suppressor is a roller.

4. In a vertical screening apparatus for simultaneously screening each side of a board with inking material in which a first and second vertically oriented chase are mounted in opposing spaced relationship with respect to each other, wherein a screening membrane is mounted within each of said first and second chase, and which opposing flood blades and print squeegees are vertically reciprocated through flood and print sequences on opposite sides of said first and second chase, and a board transport mechanism is synchronously integrated therewith for sequentially moving said board upright into and out of a print zone between said between said first and second chase respectively before and after said vertical reciprocation, the improvement comprising a spot suppressor vertically reciprocated on each of said screening membranes in sequence with vertical reciprocation of said print squeegees and said flood blades, wherein said spot suppressor suppresses said inking material by forcing each of said screening membranes in contact with each other after sid print sequence.

5. The improvement according to claim 4, wherein said spot suppressor is a roller.

6. The apparatus according to claim 5, wherein said board transport mechanism comprises means for reciprocally shuttling said upright board into and out of said print zone respectively before and after said vertical reciprocation and including means for restraining the top edge of said board while it is moved into said print zone.

7. The improvement according to claim 4, wherein said spot suppressor is a squeegee.

8. The apparatus according to claim 7, wherein said board transport mechanism comprises means for reciprocally shuttling said upright board into and out of said print zone respectively before and after said vertical reciprocation and including means for restraining the top edge of said board while it is moved into said print zone.

9. The apparatus according to claim 4, wherein said board transport mechanism comprises means for reciprocally shuttling said upright board into and out of said print zone respectively before and after said vertical reciprocation and including means for restraining the top edge of said board while it is moved into said print zone.

10. A method of simultaneously screening with inking material each side of a board vertically mounted between two screening membranes, which comprises:

a) flooding the screening membranes in a first position with inking material;

b) forcing the screening membranes into a second position by means of two opposing print squeegees so that the screening membranes contact the board;

c) returning the screening membranes to the first position;

d) removing the board from the print zone; and e) forcing the screening membranes together by means of a spot suppressor apparatus thereby smearing the dots of inking material residing on the back of the screening membranes.

11. The method according to claim 10 wherein the spot suppressor apparatus comprises a pair of oppositely disposed squeegees.

12. The method according to claim 10 wherein the spot suppressor apparatus comprises a pair of oppositely disposed rollers.

* * * * *